(12) United States Patent
Hwang et al.

(10) Patent No.: US 8,339,561 B2
(45) Date of Patent: Dec. 25, 2012

(54) WIRING SUBSTRATE, TAPE PACKAGE HAVING THE SAME, AND DISPLAY DEVICE HAVING THE SAME

(75) Inventors: Ji-Hwan Hwang, Asan-si (KR); Dong-Han Kim, Osan-si (KR); Chul-Woo Kim, Cheonan-si (KR); Chung-Ye Chung, Hwaseong-si (KR); Kwang-Jin Bae, Asan-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 904 days.

(21) Appl. No.: 12/353,317

(22) Filed: Jan. 14, 2009

(65) Prior Publication Data

US 2009/0184418 A1    Jul. 23, 2009

(30) Foreign Application Priority Data

Jan. 21, 2008  (KR) .................. 10-2008-0006355

(51) Int. Cl.
G02F 1/1345    (2006.01)
(52) U.S. Cl. ..................... 349/149; 349/150
(58) Field of Classification Search .......... 349/149, 349/150, 151, 152; 174/254, 255, 260; 257/673, 257/692, 773, 784, 786; 361/749, 782, 783
See application file for complete search history.

(56) References Cited

U.S. PATENT DOCUMENTS

| | | | |
|---|---|---|---|
| 6,603,527 B1 * | 8/2003 | Hayata et al. ................ | 349/152 |
| 2002/0109814 A1 * | 8/2002 | Murahashi et al. ........... | 349/151 |
| 2005/0121796 A1 * | 6/2005 | Park et al. ..................... | 257/773 |
| 2006/0097286 A1 * | 5/2006 | Chung et al. .................. | 257/203 |
| 2007/0284707 A1 * | 12/2007 | Sugihara et al. .............. | 257/668 |
| 2009/0065934 A1 * | 3/2009 | Chung et al. .................. | 257/737 |

FOREIGN PATENT DOCUMENTS

| | | |
|---|---|---|
| JP | 2000-137239 | 5/2000 |
| JP | 2004-221320 | 8/2004 |
| JP | 2007-036283 | 2/2007 |
| KR | 1020070038234 | 4/2007 |

* cited by examiner

*Primary Examiner* — Dung Nguyen
*Assistant Examiner* — Tai Duong
(74) *Attorney, Agent, or Firm* — Stanzione & Kim, LLP (57) ABSTRACT

A wiring substrate includes a base film, a plurality of first wirings and a plurality of second wirings. The base film has a chip-mounting region configured for mounting a semiconductor chip thereon. The first wirings extend in a first direction from inside the chip-mounting region to outside the chip-mounting region, and include first connection end portions extending in a second direction different from the first direction. The first connection end portions may be formed inside the chip-mounting region and configured to electrically connect to the semiconductor chip. The second wirings extend in the first direction from inside the chip-mounting region to outside the chip-mounting region, and include second connection end portions extending in the opposite direction to the second direction in which the first connection end portions extend, and the second connection end portions may be formed inside the chip-mounting region and configured to electrically connect to the semiconductor chip.

18 Claims, 4 Drawing Sheets

WIRING SUBSTRATE, TAPE PACKAGE HAVING THE SAME, AND DISPLAY DEVICE HAVING THE SAME

CROSS-REFERENCE TO RELATED APPLICATIONS

This application claims priority under 35 U.S.C. §119 from Korean Patent Application No. 2008-6355, filed on Jan. 21, 2008 in the Korean Intellectual Property Office (KIPO), the contents of which are herein incorporated by reference in its entirety.

BACKGROUND OF THE INVENTION

1. Field of the Invention

The present general inventive concept relates to a wiring substrate, a tape package having the same, and a display device having the same. More particularly, the present general inventive concept relates to a wiring substrate for mounting a semiconductor chip, a tape package having the same, and a display device having the same.

2. Description of the Related Art

Generally, semiconductor devices may be manufactured by a fabrication process for forming electrical circuits including electrical elements on a semiconductor substrate, e.g., a silicon wafer, an electrical die sorting (EDS) process for inspecting electrical properties of semiconductor chips formed by the fabrication process, and a packaging process for sealing the semiconductor chips with resin such as epoxy, and sorting the semiconductor chips.

Semiconductor chips may be electrically connected to a substrate by various methods. For example, methods of electrically connecting a semiconductor chip to a substrate may include a wire bonding process, a solder bonding process, and a tape automated bonding (TAB) process. A semiconductor device, e.g., a semiconductor chip electrically connected to a substrate, and/or a semiconductor chip package may be sealed or encapsulated with a resin during the packaging process. The resin may protect the semiconductor device and/or semiconductor chip from the environment. The semiconductor package including the semiconductor chip mounted on a substrate may also dissipate heat from the semiconductor chip to the outside through various cooling mechanisms.

A tape package is a semiconductor package using a tape substrate. The tape package may be classified as either a tape carrier package (TCP) or a chip-on-film (COF) package. Tape packages, which may be used as a driver integrated circuit (IC) component for flat-panel displays (FPDs), owe their growth to the development of the manufacturing industry for FPDs, e.g., liquid crystal displays (LCDs).

The TCP may have a structure where the semiconductor chip is bonded to an inner lead, which is exposed through a window of the tape substrate, by an inner lead bonding (ILB) process. The COF package may have a structure where the semiconductor chip is mounted on the tape substrate having no windows, and mounted by a flip-chip bonding process.

Generally, input/output (I/O) wiring patterns formed on the tape substrate may be used as external connection terminals in the TAB process. The I/O wiring patterns may be directly adhered to a printed circuit board (PCB) or a display panel to manufacture the tape package.

For example, the semiconductor chip of the COF package may be mounted on a base film. In this case, bumps are formed in a peripheral region of the semiconductor chip and the semiconductor chip is mounted on the base film via the bumps by a flip-chip bonding process.

I/O wirings are formed on the base film. The I/O wirings include a connection end portion that is adhered to the bump of the semiconductor chip. A solder resist may be coated on the base film outside a chip-mounting region where the semiconductor chip is mounted thereon to protect the I/O wirings from the outside. On the other hand, the semiconductor chip may be mounted on the chip-mounting region that is exposed by the solder resist.

The wiring pattern of the tape package is required to have a finer pitch as FPDs are becoming miniaturized, slimmer and lightweight. Accordingly, pitches between the bumps of the semiconductor chip and between the I/O wirings are being reduced.

However, in conventional COF packages, alignment errors between the bumps and the I/O wires, which are adhered to each other, may occur in the chip-mounting region due to the fine pitches. Further, shorts between adjacent I/O wirings or between the bumps and the I/O wires may occur.

SUMMARY OF THE INVENTION

The present general inventive concept provides a wiring substrate capable of preventing alignment errors of wirings having fine pitches. Further embodiment may provide a tape package including a semiconductor chip mounted on a wiring substrate, and a display device including the tape package.

Additional aspects and utilities of the present general inventive concept will be set forth in part in the description which follows and, in part, will be obvious from the description, or may be learned by practice of the general inventive concept.

An embodiment of the present general inventive concept may be achieved by providing a wiring substrate including a base film, a plurality of first wirings and a plurality of second wirings. The base film has a chip-mounting region configured to mount a semiconductor chip thereon. The plurality of first wirings extend in a first direction from inside the chip-mounting region to outside the chip-mounting region, the first wirings including first connection end portions extending in a second direction different from the first direction, and the first connection end portions being formed inside the chip-mounting region and configured to electrically connect to the semiconductor chip. The plurality of second wirings extend in the first direction from inside the chip-mounting region to outside the chip-mounting region, the second wirings including second connection end portions extending in the opposite direction to the second direction in which the first connection end portions extend, and the second connection end portions being formed inside the chip-mounting region and configured to electrically connect to the semiconductor chip.

The first direction may be perpendicular to the extending direction of a side of the chip-mounting region and the second direction may be perpendicular to the first direction.

The first connection end portions of the first wirings may be respectively arranged in a plurality of first lines parallel to the extending direction of the side of the chip-mounting region and the second connection end portions of the second wirings may be respectively arranged in a plurality of second lines positioned between the adjacent first connection end portions.

The distance between the first and second connection end portions may become greater the further the first and second end portions are spaced from the side of the chip-mounting region. Additionally, the sizes of the first and second connection end portions which are closest to the side of the chip-mounting region may be smaller than those of the other connection end portions.

The wiring substrate may further include an insulating member covering portions of the first and second wirings except for the first and second connection end portions that extend within the chip-mounting portion.

An embodiment of the present general inventive concept may be achieved by providing a tape package including a semiconductor chip, a base film, a plurality of first wirings and a plurality of second wirings. The semiconductor chip includes bumps formed thereon. The base film has a chip-mounting region configured to mount the semiconductor chip thereon. The first wirings extend in a first direction from inside the chip-mounting region to outside the chip-mounting region, the first wirings including first connection end portions extending in a second direction different from the first direction, and the first connection end portions being formed inside the chip-mounting region and adhered to the bumps of the semiconductor chip. The second wirings extend in the first direction from inside the chip-mounting region to the chip-mounting region, the second wirings including second connection end portions extending in the opposite direction to the second direction in which the first connection end portions extend, and the second connection end portions being formed inside the chip-mounting region and adhered to the bumps of the semiconductor chip.

The first direction may be perpendicular to the extending direction of a side of the chip-mounting region and the second direction may be perpendicular to the first direction.

The first connection end portions of the first wirings may be respectively arranged in a plurality of first lines parallel to the extending direction of the side of the chip-mounting region, the second connection end portions of the second wirings may be respectively arranged in a plurality of second lines positioned between the adjacent first connection end portions, and the bumps may be respectively arranged to correspond to the first and second connection end portions.

The distance between the first and second connection end portions may become greater the further the first and second end portions are spaced from the side of the chip-mounting region and the distance between the bumps may become greater the further the bumps are spaced from the side of the semiconductor chip. In this case, the bumps may include first bumps adhered to the first and second connection end portions respectively arranged closest to the side of the chip-mounting region, the first bumps having a first size and second bumps adhered to the first and second connection end portions arranged in the lines that are not the closest to the side of the chip-mounting region, the second bumps having a second size greater than the first size. Additionally, the first bumps may have an L-shape.

The tape package may further include a plastic resin for protecting a bonding region of the semiconductor chip and the base film.

An embodiment of the present general inventive concept may be achieved by providing a display device includes a tape package, a printed circuit board (PCB) and a display panel. The tape package includes a semiconductor chip including bumps formed thereon; a base film including a chip-mounting region, the chip-mounting region configured for mounting the semiconductor chip thereon; a plurality of first wirings extending in a first direction from inside the chip-mounting region to outside the chip-mounting region, the first wirings including first connection end portions extending in a second direction different from the first direction, and the first connection end portions being formed inside the chip-mounting region and adhered to the bumps of the semiconductor chip; and a plurality of second wirings extending in the first direction from inside the chip-mounting region to outside the chip-mounting region, the second wirings including second connection end portions extending in the opposite direction to the second direction in which the first connection end portions extend, and the second connection end portions being formed inside the chip-mounting region and adhered to the bumps of the semiconductor chip. The PCB is disposed at a first side of the tape package and electrically connected to input wirings of the first and second wirings. The display panel is disposed at a second side of the tape package opposite the first side and electrically connected to output wirings of the first and second wirings.

The first direction is perpendicular to the extending direction of a side of the chip-mounting region and the second direction is perpendicular to the first direction.

The first connection end portions of the first wirings are respectively arranged in a plurality of first lines parallel to the extending direction of the side of the chip-mounting region, the second connection end portions of the second wirings are respectively arranged in a plurality of second lines positioned between the adjacent first connection end portions, and the bumps are respectively arranged parallel to the second direction on the first and second lines corresponding to the first and second connection end portions.

The distance between the first and second connection end portions becomes greater away from the side of the chip-mounting region and the distance between the bumps becomes greater away from the side of the semiconductor chip corresponding to the first and second connection end portions.

The bumps including first bumps adhered to the first and second connection end portions respectively arranged closest to the side of the chip-mounting region, the first bumps having a first size and second bumps adhered to the first and second connection end portions respectively arranged in the lines that are not closest to the side of the chip-mounting region, the second bumps having a second size greater than the first size. The first bumps have an L-shape.

An embodiment of the present general inventive concept may be achieved by providing a wiring substrate including a flexible base film including a chip-mounting region, a plurality of first wirings including first connection end portions within the chip-mounting region, and a plurality of second wirings including second connection end portions within the chip-mounting region, wherein the first connection end portions and the second connection end portions together form a V-shape as the first connection end portions and the second connection end portions approach a center of the chip-mounting region.

An embodiment of the present general inventive concept may be achieved by providing a tape package including a base film including a chip-mounting region, and a semiconductor chip mounted to the chip-mounting region, the semiconductor chip including a plurality of bumps formed on the semiconductor chip, wherein the plurality of bumps include first bumps adjacent an edge of the chip-mounting region and second bumps not adjacent an edge of the chip-mounting region, and wherein the plurality of bumps form a V-shape as the plurality of bumps approach a center of the chip-mounting region. The second bumps are larger than the first bumps.

An embodiment of the present general inventive concept may be achieved by providing a flexible tape package including a flexible base film including a chip-mounting region, a plurality of first wirings including a plurality of first connection end portions within the chip-mounting region, and a plurality of second wirings including a plurality of second connection end portions within the chip-mounting region, wherein the size of the plurality of first connection end portions and the size of the plurality of second connection end portions is smaller closer to an edge of the chip-mounting region than the size of the plurality of first connection end portions and the size of the plurality of second connection end portions that are closer to a center of the chip-mounting region.

An embodiment of the present general inventive concept may be achieved by providing a tape package including a base film including a chip-mounting region, a semiconductor chip mounted to the chip-mounting region, the semiconductor chip including a plurality of bumps formed on the semiconductor chip, and a bonding region formed between the base film and the semiconductor chip, wherein the plurality of bumps include first bumps adjacent an edge of the chip-mounting region and second bumps not adjacent an edge of the chip-mounting region, and wherein the plurality of bumps form an outward taper shape as the plurality of bumps approach a center of the chip-mounting region. The first bumps are smaller than the second bumps.

An embodiment of the present general inventive concept may be achieved by providing a method of forming a flexible tape package, including forming a chip-mounting region on a flexible base film, mounting a semiconductor chip on the chip-mounting region, wherein the semiconductor chip includes a plurality of bumps formed thereon, and forming the plurality of bumps in a V-shape such that the distance between the plurality of bumps becomes wider as the plurality of bumps approach a center of the chip-mounting region.

An embodiment of the present general inventive concept may be achieved by providing a method of forming a flexible tape package, including forming a chip-mounting region on a flexible base film, mounting a semiconductor chip on the chip-mounting region, wherein the semiconductor chip includes bumps formed thereon, forming a bonding region between the flexible base film and the semiconductor chip, forming the bumps in a V-shape such that the distance between the bumps becomes wider as the bumps approach a center of the chip-mounting region, and forming a plastic resin within the bonding region, such that when the bonding region is filled with the plastic resin, the plastic resin is easily underfilled inside the chip-mounting section.

The wiring substrate in accordance with the present general inventive concept may include a base film having a chip-mounting region configured for mounting a semiconductor chip thereon. A plurality of first and second wirings extending in a first direction from the chip-mounting region are formed on the base film. First wirings may include first connection end portions extending in a second direction inclined to the first direction and may be electrically connected to the semiconductor chip. The second wirings may include second connection end portions extending in the opposite direction to the second direction in which the first connection end portions extend and may be electrically connected to the semiconductor chip.

Accordingly, the first and second connection end portions may extend perpendicular to end portions of the first and second wirings, and be staggered from the side of the chip-mounting region to inside of the chip-mounting region. Therefore, shorts between the adjacent wirings may be prevented and a sufficient arrangement margin for the wirings that are adhered to bumps of the semiconductor chip may be provided, though the first and second wirings may be densely formed along the side of the chip-mounting region.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Various embodiments will be described more fully hereinafter with reference to the accompanying drawings. The present general inventive concept may, however, be embodied in many different forms and should not be construed as limited to the embodiments set forth herein. Rather, these embodiments are provided so that this disclosure will convey the scope of the present general inventive concept to those skilled in the art. In the drawings, the sizes and relative sizes of layers and regions may be exaggerated for clarity.

It will be understood that when an element or layer is referred to as being "on," "connected to" or "coupled to" another element or layer, the element or layer may be directly on, connected to, coupled with or coupled to another element or layer, through intervening elements or layers. In contrast, when an element is referred to as being "directly on," "directly connected to" or "directly coupled to" another element or layer, there are no intervening elements or layers present. In the disclosure, numerals refer to like elements throughout. As used herein, the term "and/or" may include any and all combinations of one or more of the associated listed items.

It will be understood that, although the terms first, second, third, etc. may be used herein to describe various elements, components, regions, layers and/or sections these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present general inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other angles or orientations) and the spatially relative descriptors used herein interpreted accordingly.

The terminology used herein is for the purpose of describing particular example embodiments only and is not intended to be limiting of the present general inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present general inventive concept.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 1:
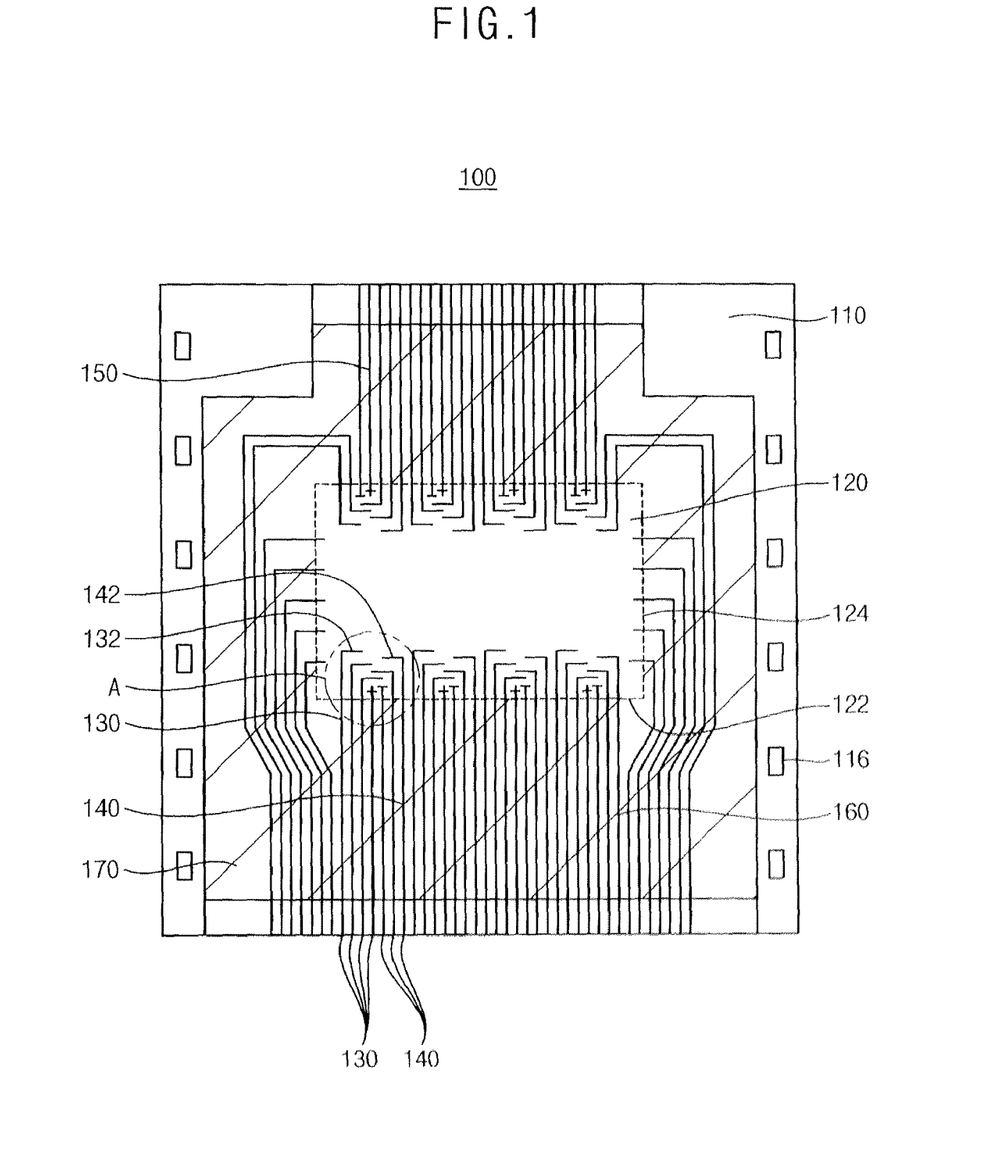
FIG. 1 is a plan view illustrating a wiring substrate in accordance with some example embodiments.

FIG. 1 is a plan view illustrating a wiring substrate in accordance with an embodiment of the present general inventive concept.

Referring to FIG. 1, a wiring substrate 100 including a semiconductor chip (not illustrated) mounted thereon includes a base film 110, a plurality of first wirings 130 and a plurality of second wirings 140 formed on the base film 110.

In an exemplary embodiment of the general inventive concept, a chip-mounting region 120 where the semiconductor chip is mounted may be provided in the middle of the base film 110. For example, the chip-mounting region 120 may have a rectangular shape. The chip-mounting region 120 may include a first side 122 and a second side 124 adjacent to the first side 122. The length of the first side 122 may be greater than that of the second side 124.

The base film 110 may include an organic material such as a polyimide. The base film 110 may be a flexible organic film. Sprocket holes 116 may be positioned along two opposite edges of the base film 110. The sprocket holes 116 may be spaced apart from one another. The opposite edges of the base film 110 in which the sprocket holes 116 may be formed may be removed after the semiconductor chip is mounted on the base film 110.

A plurality of the first wirings 130 and a plurality of the second wirings 140 may be formed on the base film 110. The first wirings 130 and the second wirings 140 may be extended from inside the chip-mounting region 120 of the base film 110 to outside the chip-mounting region 120.

A metal thin film may be adhered to a surface of the base film 110 by an electrodeposition or a thermocompression process. A photolithography process and an etching process may be performed on the metal thin film to form the first wirings 130 and the second wirings 140. Examples of the metal thin film may be copper (Cu), gold (Au), tin (Sn), lead (Pb), silver (Ag) and nickel (Ni) or some combination thereof. However, the present embodiments are not limited thereto. Additionally other conductive material may be formed on the wirings to have a predetermined thickness by an electroplating or other known process.

The first wirings 130 and the second wirings 140 may extend in a first direction from inside the chip-mounting region 120 to outside the chip-mounting region 120. The first wirings 130 may include first connection end portions 132. The first connection end portion 132 is formed inside the chip-mounting region 120. The first connection end portion 132 of the first wiring 130 is adhered to a bump of the semiconductor chip when the semiconductor chip is mounted on the chip-mounting region 120. The second wirings 140 may include second connection end portions 142. The second connection end portion 142 is formed inside the chip-mounting region 120. The second connection end portion 142 is adhered to a bump of the semiconductor chip when the semiconductor chip is mounted on to the chip-mounting region 120.

The first connection end portion 132 may extend from an end portion of the first wirings 130. The first connection end portion 132 may extend in a second direction that is different from the first direction. The second connection end portion 142 may extend from an end portion of the second wirings 140. The second connection end portion may extend in an opposite direction to the second direction in which the first connection end portion extends.

In an embodiment of the present general inventive concept, the first direction may be perpendicular to the extending direction of the first side 122 of the chip-mounting region 120 and the second direction may be perpendicular to the first direction. Accordingly, the first connection end portions 132 and the second connection end portions 142 may face one another as further illustrated in the partially enclosed view "A" also illustrated in FIG. 3.

The first connection end portions 132 of the first wirings 130 may be respectively arranged in a plurality of first lines parallel to the extending direction of the first side 122 of the chip-mounting region 120. The second connection end portions 142 of the second wirings 140 may be respectively arranged in a plurality of second lines positioned between the adjacent first connection end portions 132.

The distance between the first connection end portion 132 and the second connection end portion 142 may become greater away from the first side 122 of the chip-mounting region 120 than is the distance between the first connection end portion 132 and the second connection end portion 142 closer to the first side 122 of the chip-mounting region 120.

Accordingly, the first and second connection end portions 132 and 142 may extend perpendicular to end portions of the first and second wirings 130 and 140, respectively, and be staggered relative to each other from the first side 122 of the chip-mounting region 120 to inside of the chip-mounting region 120. As a result of this configuration, for example, electrical short circuits between adjacent wirings may be prevented. Though the first and second wirings 130 and 140 may be densely formed along the first side 122 of the chip-mounting region 120, a sufficient arrangement margin for wirings that are adhered to the bumps of the semiconductor chip may be provided.

The first and second connection end portions 132 and 142 may be arranged in the chip-mounting region 120 corresponding to the bumps of the semiconductor chip. Accordingly, the first and second connection end portions 132 and 142 may be adhered to the bumps of the semiconductor chip, so that the first and second wirings 130 and 140 may be electrically connected to the semiconductor chip.

In example embodiments, the first and second wirings 130 and 140 may include input wirings 150 and output wirings 160. The input wirings 150 extend upwardly from the chip-mounting region 120. The output wirings 160 extend downwardly from the chip-mounting region 120.

For example, a printed circuit board (PCB) (not illustrated) to provide an input signal to the semiconductor chip may be electrically connected by the input wirings 150 to the semiconductor chip mounted on the chip-mounting region 120. A display panel (not illustrated) to receive an output signal from the semiconductor chip may be electrically connected by the output wirings 160 to the semiconductor chip mounted on the chip-mounting region 120.

An insulating member 170 may be coated on the first and second wirings 130 and 140. The insulating member 170 may cover portions of the first and second wirings 130 and 140, except for the first and second connection end portions 132 and 142 that extend within the chip-mounting region 120. For example, the insulating member 170 may include a solder resist. Accordingly, the first and second wirings 130 and 140 many be protected from the outside by the insulation member 170 and electrical short circuits between the wirings may be prevented.

Figure 2:
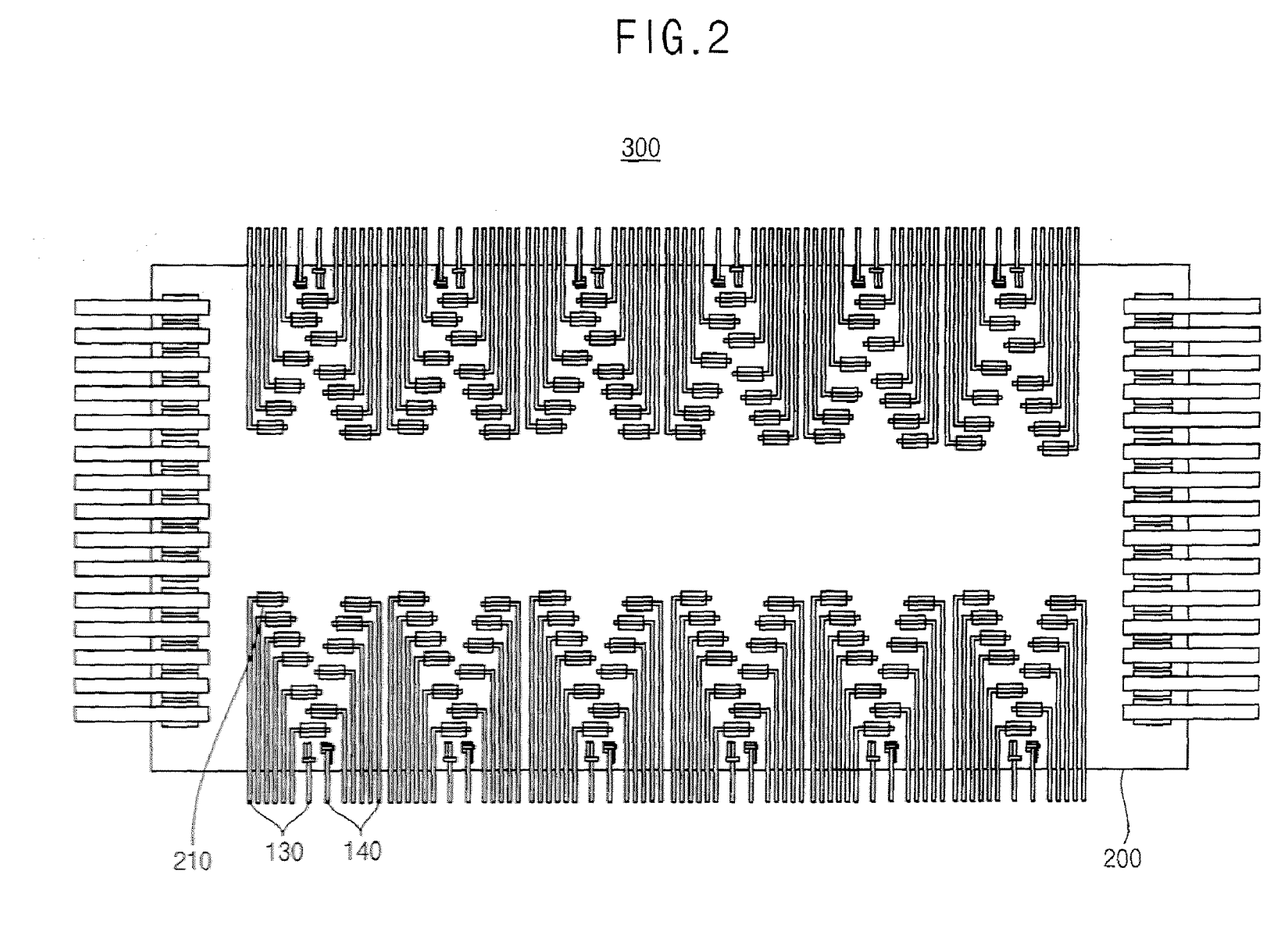
FIG. 2 is a plan view illustrating a portion of a tape package including a semiconductor chip mounted on the wiring substrate in FIG. 1.
Figure 3:
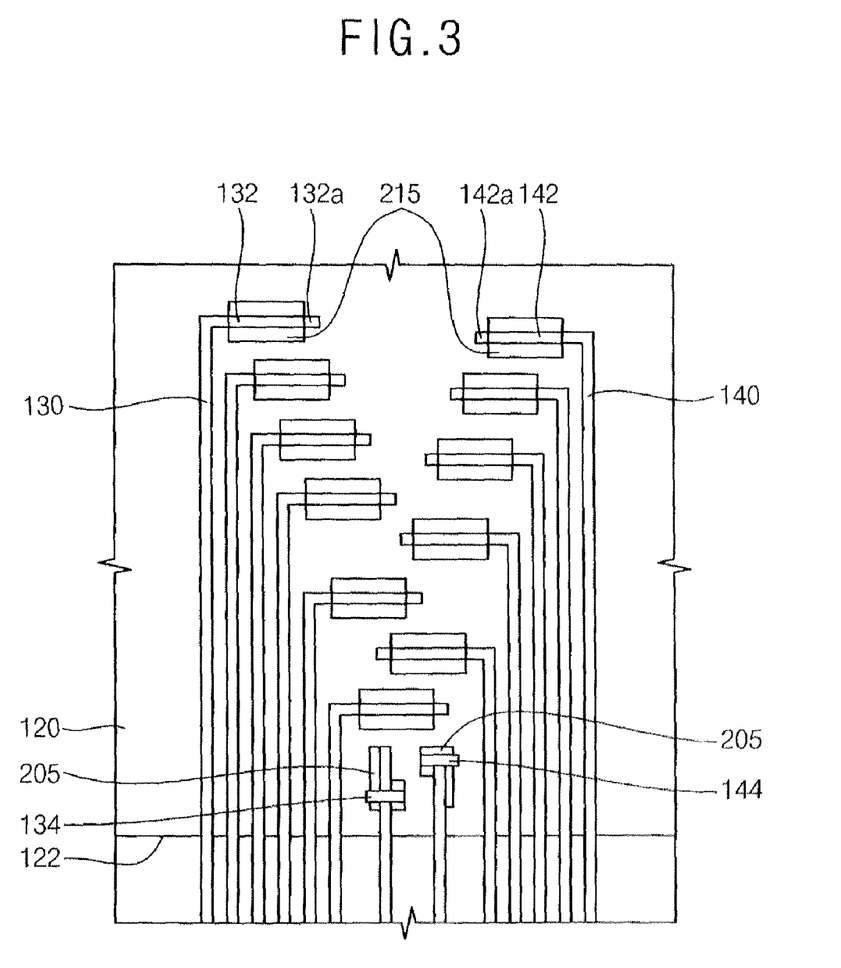
FIG. 3 is a partially enlarged view illustrating a portion "A" in FIG. 1.

FIG. 2 is a plan view illustrating a portion of a tape package including a semiconductor chip mounted on the wiring substrate of FIG. 1. FIG. 3 is a partially enlarged view illustrating a portion "A" in FIG. 1.

Referring to FIGS. 1 to 3, a flexible tape package 300 in accordance with some example embodiments includes a flexible base film 110, a semiconductor chip 200 mounted on the base film 110 and the first and second wirings 130 and 140 formed on the base film 110.

The semiconductor chip 200 including integrated circuits (ICs) may be mounted on the chip-mounting region 120 of the base film 100. The semiconductor chip 200 may include a plurality of bumps 210. The bumps 210 of the semiconductor chip 200 may be arranged corresponding to the first and second connection end portions 132 and 142 that extend in end portions of the first and second wirings 130 and 140. The bumps 210 of the semiconductor chip 200 may be respectively adhered to the first and second connection end portions 132 and 142.

The bumps 210 may include gold (Au) and/or copper (Cu) or other metals, either singly or in combination. The bumps 210 may be adhered to the first and second connection end portions 132 and 142 by the flip-chip bonding process. The semiconductor chip may be attached upright, or attached in a flip-chip configuration. Therefore, the bumps 210 may be located either on the top side or the bottom side of the semiconductor chip (not illustrated).

The semiconductor chip 200 may be mounted on the base film 110 via the bumps 210. In an example embodiment, a plastic resin (not illustrated) may be injected into a bonding region of the base film 110 and the semiconductor chip 200. For example, the plastic resin may be injected into the bonding region of the semiconductor chip 200 through an underfill process or other process known in the art.

Referring to FIG. 3, the first wirings 130 and the second wirings 140 may extend in a first direction from inside the chip-mounting region 120 to outside the chip-mounting region 120. The first wirings 130 may respectively include the first connection end portions 132 that are formed inside the chip-mounting region 120 and adhered to bumps 210 of the semiconductor chip. The second wirings 140 may respectively include the second connection end portions 142 that are formed inside the chip-mounting region 120 and adhered to the bumps 210 of the semiconductor chip.

The first connection end portions 132 may extend from end portions of the first wirings 130. The first connection end portions 132 may extend in a second direction that is different from the first direction. The second connection end portions 142 may extend from end portions of the second wirings 140, respectively. The second connection end portions 142 may extend in an opposite direction to the second direction in which the first connection end portions 132 extend.

In an example embodiment, the first direction may be perpendicular to the extending direction of the first side 122 of the chip-mounting region 120 and the second direction may be perpendicular to the first direction. Accordingly, as illustrated in FIG. 3, the edges 132a of the first connection end portions 132 and the edges 142a of the second connection end portions 142 may face one another.

The first connection end portions 132 of the first wirings 130 may be respectively arranged along a plurality of first lines parallel to the extending direction of the first side 122 of the chip-mounting region 120. The second connection end portions 142 of the second wirings 140 may be respectively arranged along a plurality of second lines that may be positioned between adjacent first connection end portions 132. That is, the first connection end portions 132 and the second connection end portions 142 may alternate in a direction perpendicular to the extending direction of the first side 122 of the chip-mounting region 120. The bumps 210 may have a rectangular shape and be respectively arranged to correspond to the first and second lines parallel to the second direction that correspond to the first and second connection end portions 132 and 142.

The distance between the first connection end portion 132 and the second connection end portion 142 may become greater the further the first connection end portion 132 and the second end portion 142 are spaced from the first side 122 of the chip-mounting region 120. Also, the distance between the bumps 210 corresponding to the first connection end portion 132 and the second connection end portion 142 may become greater the further the bumps are spaced from the side of the semiconductor chip 200 corresponding to the first and second connection end portions 132 and 142. Therefore, the width between bumps 210 as well as the width between the first connection end portion 132 and the second connection end portion 142 becomes tapered outward, or forms a V-shape, as the plurality of bumps 210 approach the center of the chip-mounting region 120. An increased number of connections to a semiconductor chip may thus be realized in that more bumps may be attached to a larger area of a semiconductor chip, not just to the periphery as is known in the related art. This configuration also allows for a fine pitch between the plurality of wirings, as the first connection end portion 132 and second connection end portion 142 that connect to the bumps of a semiconductor device are spaced out as the first and second connection end portions approach the center of the chip-mounting region 120.

Because of the increasing distance between the first connection end portion 132 and the second connection end portion 142 and thus the increased distance between the bumps 210, when the bonding region between the semiconductor chip 200 and the chip mounting region is filled with plastic resin, the plastic resin may be easily underfilled inside the chip-mounting region 120.

As further illustrated in FIG. 3, according to another embodiment of the present general inventive concept, the sizes of third and fourth connection end portions 134 and 144 which are arranged closest to the first side 122 of the chip-mounting region 120 may be smaller than the first connection end portion 132 and the second connection end portion 142. Additionally, the bumps 210 may include first bumps 205 and second bumps 215.

The first bumps 205 may be adhered to the third and fourth connection end portions 134 and 144 that are respectively arranged closer to the first side 122 of the chip-mounting region 120 than the second bumps 215. The second bumps 215 may be adhered to the first and second connection end portions 132 and 142 that are spaced away from the first side 122 of the chip-mounting region 120. In this case, the size of the first bump 205 may be smaller than that of the second bump 215. The first bumps 205 may have an L-shape, to thereby provide a sufficient arrangement margin for the wirings that are adhered to the bumps of the semiconductor chip.

Figure 4:
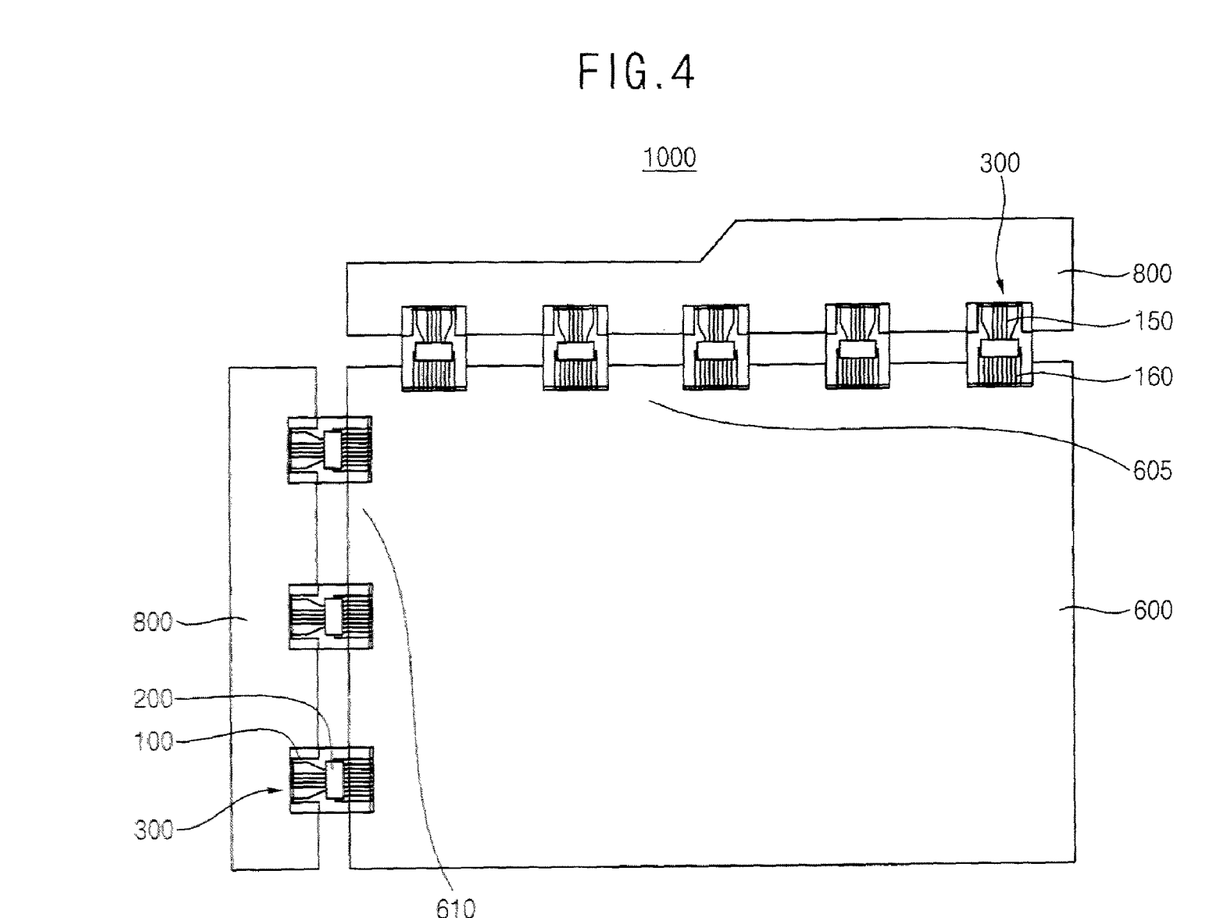
FIG. 4 is a plan view illustrating a display device including the tape package in FIG. 2.

FIG. 4 is a plan view illustrating a display device including the tape package in FIG. 2. The tape package 300 of the present embodiment may be substantially the same as in the embodiment of FIG. 2, and further including a PCB 800 and a display panel 600 adhered to the tape package 300. Thus, the same reference numerals will be used to refer to the same or similar parts as those described in the embodiment illustrated in FIG. 2.

Referring to FIG. 4, a display device 1000 in accordance with example embodiments includes a tape package 300, a display panel 600 and a PCB 800.

The tape package 300 may be disposed between the display panel 6300 and the PCB 800. The PCB may be disposed at a first side portion of the tape package 300. The display panel 600 may be disposed at a second side portion opposite to the first side portion of the tape package 300.

The input wirings 150 of the tape package 300 may be electrically connected to the PCB 800. The output wirings 160 of the tape package 300 may be electrically connected to the display panel 600.

The display panel 600 may include a plurality of gate lines, a plurality of data lines and a plurality of pixels (not illustrated). The pixels may be formed on each intersection of the gate lines and the data lines. The pixels may include a thin-film transistor (TFT) having a gate electrode connected to the gate line and a source electrode connected to the data line.

The semiconductor chip 200 mounted on the tape package 300 may include driving circuits (not illustrated) for driving the display panel 600. For example, the semiconductor chips 200 of the tape package 300 may combine with a first side 605 of the display panel 600 and may include a gate driver (not illustrated) for driving the gate lines of the display panel 600. The semiconductor chips 200 of the tape package 300 that combine with a second side 610 of the display panel substantially perpendicular to the first side 605 of the display panel 600 may include a data driver (not illustrated) for driving the data lines of the display panel 600.

The PCB 800 may be electrically connected to the input wirings 150 of the tape package 300. For example, the PCB 800 may include a timing control unit (not illustrated) and a power supply unit (not illustrated). The timing control unit may control a driving timing of the gate driver and the data driver. The power supply unit may supply power required for driving the display panel 600 and the semiconductor chip 200 that is mounted on the tape package 300.

As mentioned above, the wiring substrate in accordance with example embodiments of the present general inventive concept may include a base film having a chip-mounting region configured for mounting a semiconductor chip thereon. A plurality of first and second wirings extending in a first direction from the chip-mounting region are formed on the base film. First wirings may include first connection end portions extending in a second direction that is different from the first direction and may be electrically connected to the semiconductor chip. The second wirings may include second connection end portions extending in the opposite direction to the second direction from which the first connection end portions extend and may be electrically connected to the semiconductor chip.

Accordingly, the first and second connection end portions may extend perpendicular to end portions of the first and second wirings, and be staggered relative to each other from the side of the chip-mounting region to inside of the chip-mounting region. Therefore, electrical short circuits between the adjacent wirings may be prevented and a sufficient arrangement margin for the wirings that are adhered to bumps of the semiconductor for chip may be provided, though the first and second wirings may be densely formed along the side of the chip-mounting region.

The foregoing is illustrative of example embodiments which are not to be construed as limiting the scope of the present general inventive concept herein. Although a few example embodiments have been described, those skilled in the art will readily appreciate that changes may be made without materially departing from the novel teachings and advantages of the present general inventive concept. Accordingly, modifications or equivalents are intended to be included within the scope of the present general inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:
1. A wiring substrate comprising:
   a base film including a chip-mounting region, the chip-mounting region configured to mount a semiconductor chip thereon;
   a plurality of first wirings extending in a first direction from inside the chip-mounting region to outside the chip-mounting region, the first wirings including first connection end portions extending in a second direction different from the first direction, and the first connection end portions being formed inside the chip-mounting region and configured to electrically connect to the semiconductor chip; and a plurality of second wirings extending in the first direction from inside the chip-mounting region to outside the chip-mounting region, the second wirings including second connection end portions extending in the opposite direction to the second direction in which the first connection end portions extend, and the second connection end portions being formed inside the chip-mounting region and configured to electrically connect to the semiconductor chip, wherein the first connection end portions of the first wirings are respectively arranged in a plurality of first lines parallel to an extending direction of a side of the chip-mounting region and the second connection end portions of the second wirings are respectively arranged in a plurality of second lines positioned between the adjacent first connection end portions.

2. The wiring substrate of claim 1, wherein the first direction is perpendicular to the extending direction of a side of the chip-mounting region and the second direction is perpendicular to the first direction.

3. The wiring substrate of claim 1, wherein a distance between the first and second connection end portions becomes greater the further the first and second end portions are spaced from the side of the chip-mounting region.

4. The wiring substrate of claim 3, wherein the sizes of the first and second connection end portions closest to the side of the chip-mounting region are smaller than those of the other connection end portions.

5. The wiring substrate of claim 1, further comprising:
an insulating member covering portions of the first and second wirings except for the first and second connection end portions that extend within the chip-mounting region.

6. A tape package comprising:
a semiconductor chip including bumps formed thereon;
a base film including a chip-mounting region, the chip-mounting region configured to mount the semiconductor chip thereon;
a plurality of first wirings extending in a first direction from inside the chip-mounting region to outside the chip-mounting region, the first wirings including first connection end portions extending in a second direction different from the first direction, and the first connection end portions being formed inside the chip-mounting region and adhered to the bumps of the semiconductor chip; and
a plurality of second wirings extending in the first direction from inside the chip-mounting region to the chip-mounting region, the second wirings including second connection end portions extending in the opposite direction to the second direction in which the first connection end portions extend, and the second connection end portions being formed inside the chip-mounting region and adhered to the bumps of the semiconductor chip,
wherein a distance between the first and second connection end portions becomes greater the further the first and second end portions are spaced from a side of the chip-mounting region.

7. The tape package of claim 6, wherein the first direction is perpendicular to an extending direction of a side of the chip-mounting region and the second direction is perpendicular to the first direction.

8. The tape package of claim 6, wherein the first connection end portions of the first wirings are respectively arranged in a plurality of first lines parallel to an extending direction of the side of the chip-mounting region, the second connection end portions of the second wirings are respectively arranged in a plurality of second lines positioned between the adjacent first connection end portions and the bumps are respectively arranged to correspond to the first and second connection end portions.

9. The tape package of claim 6, wherein a distance between the bumps becomes greater the further the bumps are spaced from the side of the semiconductor chip.

10. The tape package of claim 9, wherein the bumps comprise:
first bumps adhered to the first and second connection end portions respectively arranged closer to the side of the chip-mounting region than second bumps, the first bumps having a first size; and
second bumps adhered to the first and second connection end portions arranged in the lines further from the side of the chip-mounting region than the first bumps, the second bumps having a second size greater than the first size.

11. The tape package of claim 10, wherein the first bumps have an L-shape.

12. The tape package of claim 6, further comprising a plastic resin for protecting a bonding region of the semiconductor chip and the base film.

13. A display device comprising:
a tape package including:
a semiconductor chip including first bumps and second bumps formed thereon;
a base film including a chip-mounting region, the chip-mounting region configured for mounting the semiconductor chip thereon;
a plurality of first wirings extending in a first direction from inside the chip-mounting region to outside the chip-mounting region, the first wirings including first connection end portions extending in a second direction different from the first direction, and the first connection end portions being formed inside the chip-mounting region and adhered to the first bumps of the semiconductor chip; and
a plurality of second wirings extending in the first direction from inside the chip-mounting region to outside the chip-mounting region, the second wirings including second connection end portions extending in the opposite direction to the second direction in which the first connection end portions extend, and the second connection end portions being formed inside the chip-mounting region and adhered to the second bumps of the semiconductor chip;
a printed circuit board (PCB) disposed at a first side of the tape package, the PCB being electrically connected to input wirings of the first and second wirings; and
a display panel disposed at a second side of the tape package opposite the first side, the display panel being electrically connected to output wirings of the first and second wirings,
wherein the distance between the first bumps and second bumps corresponding to the respective first and second connection end portions becomes greater away from a side of the semiconductor chip.

14. The display device of claim 13, wherein the first direction is perpendicular to an extending direction of a side of the chip-mounting region and the second direction is perpendicular to the first direction.

15. The display device of claim 13, wherein the first connection end portions of the first wirings are respectively arranged in a plurality of first lines parallel to an extending direction of a side of the chip-mounting region, the second connection end portions of the second wirings are respectively arranged in a plurality of second lines positioned between the adjacent first connection end portions, and the bumps are respectively arranged parallel to the second direction on the first and second lines corresponding to the first and second connection end portions.

16. The display device of claim 13, wherein a distance between the first and second connection end portions becomes greater away from the side of the chip-mounting region.

17. The display device of claim 16, wherein the bumps comprise:

first bumps adhered to the first and second connection end portions respectively arranged closer to the side of the chip-mounting region than second bumps, the first bumps having a first size; and second bumps adhered to the first and second connection end portions respectively arranged in the lines that are further from the side of the chip-mounting region than the first bumps, the second bumps having a second size greater than the first size.

18. The display device of claim 17, wherein the first bumps have an L-shape.

* * * * *